(12) United States Patent
Okada et al.

(10) Patent No.: US 6,451,673 B1
(45) Date of Patent: Sep. 17, 2002

(54) CARRIER GAS MODIFICATION FOR PRESERVATION OF MASK LAYER DURING PLASMA ETCHING

(75) Inventors: Lynne A. Okada, Sunnyvale; Calvin T. Gabriel, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/805,918

(22) Filed: Mar. 15, 2001

Related U.S. Application Data
(60) Provisional application No. 60/268,697, filed on Feb. 15, 2001.

(51) Int. Cl.[7] .............................................. H01L 29/00
(52) U.S. Cl. ...................................... 438/513; 438/714
(58) Field of Search ................................ 438/296, 359, 438/424, 513, 524, 555, 637, 696, 689, 700, 712, 714, 719, 942

(56) References Cited

U.S. PATENT DOCUMENTS

| | | | | |
|---|---|---|---|---|
| 6,051,503 A | * | 4/2000 | Bhardwaj et al. | 438/705 |
| 6,242,165 B1 | * | 1/2001 | Vaartstra | 430/329 |
| 6,191,043 B1 | * | 2/2001 | McReynolds | 438/710 |
| 6,261,962 B1 | * | 7/2001 | Bhardwaj et al. | 438/702 |

* cited by examiner

*Primary Examiner*—David Nelms
*Assistant Examiner*—David Nhu

(57) ABSTRACT

Deleterious physical sputtering of patterned masking layers accompanying formation of recesses in, e.g., dielectric layers, by reactive plasma etching utilizing a gas mixture of at least one halogen-containing reactive plasma etching gas and Ar as an inert carrier gas/diluent for the reactive plasma etching gas, is eliminated, or at least substantially reduced, by replacing the Ar with at least one inert gas of lower atomic weight, such as He and/or Ne, and applying substantially the same level of electrical power to the plasma etching chamber as when Ar is utilized.

20 Claims, 2 Drawing Sheets

CARRIER GAS MODIFICATION FOR PRESERVATION OF MASK LAYER DURING PLASMA ETCHING

CROSS-REFERENCE TO PROVISIONAL APPLICATION

This application claims priority from U.S. provisional patent application Serial No. 60,268,697, filed Feb. 15, 2001, the entire disclosure of which is incorporated herein by reference.

CROSS-REFERENCE TO RELATED APPLICATION

This application contains subject matter similar to subject matter contained in co-pending U.S. patent application Ser. No. 09/805,973, filed on Mar. 15, 2001.

FIELD OF THE INVENTION

The present invention relates to improved methods for performing plasma etching for forming a pattern of recessed features in a substrate, e.g., via openings and/or trenches in a dielectric layer overlying a semiconductor substrate comprising at least one active device or region, utilizing an overlying mask including a pattern of openings corresponding to the pattern of features to be formed in the substrate. The present invention enjoys particular utility in semiconductor manufacture wherein ultra-thin metallization pattern masks are employed during reactive plasma etching for forming openings or recesses in a dielectric layer as part of multi-level metallization processing for formation of high integration density, semiconductor integrated circuit ("IC") devices having submicron-dimensioned design features.

BACKGROUND OF THE INVENTION

The escalating requirements for high integration density and performance associated with ultra large-scale ("ULSI") integration semiconductor device wiring and interconnection are difficult to satisfy in terms of providing submicron-dimensioned (e.g., 0.18 $\mu$m and below, such as 0.15 $\mu$m and below), low resistance-capacitance ("RC") time constant metallization patterns, particularly when the submicron-dimensioned features such as vias, contact areas, grooves, trenches, etc., have high aspect (i.e., depth-to-width) ratios due to micro-miniaturization, and accordingly, responsive changes in interconnection technology are required.

Conventional semiconductor IC devices typically comprise a semiconductor substrate, such as a monocrystalline silicon (Si) wafer including a plurality of active device regions formed thereon or therein, and a plurality of pairs of overlying, sequentially formed inter-layer dielectrics ("ILD"s) and patterned metal layers. An integrated circuit is formed therefrom containing a plurality of electrically conductive patterns comprising conductive lines separated by interwiring spaces, and a plurality of interconnect lines, such as bus lines, bit lines, word lines and logic interconnect lines. Typically, the conductive patterns of different layers, i.e., upper and lower vertically spaced-apart layers, are electrically connected by a conductive plug filling a via opening, while a conductive plug filling a contact opening establishes an electrical contact with an active device region on or in the semiconductor substrate, such as a source or drain region of a transistor. Conductive lines are formed in trenches which typically extend substantially horizontal with respect to the semiconductor substrate. Semiconductor IC devices comprising five (5) or more such levels of vertically interconnected metallization are becoming more prevalent as device geometries decrease into the deep submicron range.

A conductive plug filling a via opening is typically formed by a process sequence comprising: (1) depositing an inter-layer dielectric ("ILD") on a patterned, electrically conductive layer, e.g., a metal layer comprising at least one metal feature; (2) forming a desired opening in the ILD, as by conventional photolithographic masking and etching techniques, and filling the opening with an electrically conductive material, e.g., tungsten (W); and (3) removing excess conductive material deposited on the surface of the ILD during filling of the opening, as by chemical-mechanical polishing/planarization ("CMP").

One such method for fabricating electrically conductive vias is termed "damascene" type processing and basically involves the formation of an opening in the ILD which is filled with a metal plug. "Dual-damascene" processing techniques involve formation of an opening in an ILD comprising a lower, contact or via opening section communicating with an upper, trench opening section, followed by filling of both the lower and upper sections of the opening with an electrically conductive material, typically a metal or metallic material, to simultaneously form a conductive (via) plug in electrical contact with a conductive line.

A drawback associated with the use of damascene technology for forming submicron-dimensioned, in-laid metallization patterns and features arises from the loss of the "critical dimension" (CD) of the mask utilized in the step for forming the recesses in the dielectric layer according to conventional reactive plasma etching process for obtaining the requisite anisotropic etching of the dielectric layer, which loss of CD is attributed to sputter etching of the mask material due to bombardment thereof by ions of the carrier gas/diluent for the reactive plasma etching gas which are generated in the plasma. Loss of CD can pose a significant problem in forming recesses and metallization features according to particular design rules. In addition, the problems associated with loss of CD arising from deleterious sputter etching of the masking material is exacerbated by the requirement for use of ultra-thin layers of masking layers, e.g., from about 300 to about 1,500 Å thick, when fabricating ULSI devices having feature sizes below about 0.18 $\mu$m and with high aspect ratios.

Adverting to FIGS. 1(A)–1(C), shown therein in simplified, cross-sectional schematic form, are views successively illustrating initial, intermediate, and final stages of a conventional reactive plasma etching process for forming submicron-dimensioned recesses in a dielectric layer, utilizing a patterned mask having an initial CD. Referring more particularly to FIG. 1(A), a workpiece 1 is provided in an initial state, comprising a substrate 2, typically of a semiconductor such as a wafer of monocrystalline silicon (Si) or gallium arsenide (GaAs) including at least one active device region or layer formed therein or thereon; a dielectric layer 3, such as an ILD layer, formed on the upper surface of substrate 2 and comprised of one or more inorganic- and/or organic-based dielectric materials, e.g., a low dielectric constant ("low k") material; and a thin, patterned masking layer 4 formed on the upper surface of the dielectric layer 3 and including at least one opening 5 formed therein, as by conventional photolithographic masking and etching techniques, the opening 5 having a critical dimension CD, e.g., for defining the width or diameter of a trench or groove to be formed in the underlying dielectric layer 3. When utilized in the formation of recesses with design features in the submicron range, the thin mask layer 4 preferably is ultra-thin (e.g., from about 300 about 1,500 Å thick and may be formed of an organic-based photoresist material (e.g., an acetal-type UV-sensitive resin) or an inorganic-based hard mask material (e.g., a silicon nitride).

Referring now to FIG. 1(B), the workpiece 1 including the patterned masking layer 4 is installed within the interior space of a plasma etching chamber and subjected to conventional, anisotropic, reactive plasma etching utilizing a halogen-containing reactive plasma, e.g., a fluorine-containing plasma, for forming a recess 6 in the surface of the dielectric layer 3, the reactive plasma being generated by supplying a gaseous mixture of at least one halogen containing gas (e.g., $CCl_4$, $CF_4$, $C_4F_8$, $CCl_2F_2$, etc.) as a reactive plasma etching gas, optionally admixed with at least one of oxygen ($O_2$) gas, nitrogen ($N_2$) gas, and hydrogen ($H_2$) gas), and argon (Ar) as an inert carrier gas/diluent for the reactive plasma etching gas, to the plasma etching chamber while maintaining the interior space thereof at a reduced pressure and applying radio frequency ("RF") of microwave ("$\mu$wave") electrical power thereto (e.g., at a power of about 1500 W) to generate a reactive plasma therein. FIG. 1(B) illustrates the etch profiles of workpiece 1 approximately half-way through the etching process. As shown therein, portions 4' (represented by dashed lines in the figure) of the thin masking layer 4 bordering the mask opening 5 have been lost (i.e., consumed) due to sputtering therefrom which is incidental to the reactive etching process and is attributed to bombardment of the masking layer 4 by ions of the inert carrier gas/diluent, i.e., Ar+ ions, generated in the plasma and accelerated towards the surfaces of the workpiece 1. As a consequence of the sputter etching of masking layer 4 and resultant loss (i.e., expansion) of the CD, the sidewalls 6' of recess 6 have begun to exhibit a slight to moderate amount of inward tapering, i.e., a deviation from perpendicularity with the upper surface of the dielectric layer 3.

At the completion of the etching process, as shown in FIG. 1(C), relatively large portions 4" of the masking layer 4 (again represented by dashed lines in the figure) have been lost or consumed due to sputtering therefrom and the inward tapering of the recess sidewalls 6' is quite substantial, resulting in considerable loss in CD, i.e., respective increases to $CD+\Delta CD_1$ and $CD+\Delta CD_2$ at the top and bottom of the recess 6, leading to an undesirable increase in the dimensions of recess 6, particularly at the top, or mouth portion thereof adjacent the upper surface of the dielectric layer 3. Thus, it is apparent that the CD cannot be adequately maintained during recess formation according to conventional reactive plasma etching processing as described above.

As design rules extend further into the submicron range, e.g., about 0.18 $\mu$m and below, such as 0.15 $\mu$m and below, and the number of metallization levels increases, necessitating a corresponding increase in the requisite number of reactive etching steps for forming recesses such as vias, trenches, grooves, etc., maintenance of the critical feature sizes or dimensions of the metallization/interconnect pattern becomes increasingly important. Accordingly, the problem of increased feature size resulting from undesired coincidental sputtering of the thin masking layer causing loss of the CD during recess formation requires resolution.

Thus there exists a need for reactive plasma methodology enabling the formation of submicron-dimensioned metal vias, contacts, interconnection and routing members, etc., having desired feature sizes with high reliability and performance, and at high product yield. Specifically, there exists a need for methodology for eliminating the problem of loss of CD during formation of submicron-dimensioned recesses which are subsequently filled with an electrically conductive material, e.g., a metal or metal alloy, which methodology is rapid, cost-effective, and avoids the drawbacks and disadvantages associated with conventional reactive plasma etching techniques and provides, inter alia, no or at least a substantially reduced amount of disadvantageous, deleterious physical sputtering of the masking layer.

The present invention, wherein deleterious physical sputtering of a patterned during recess formation by reactive plasma etching is eliminated, or at least substantially reduced, in which: (1) argon (Ar) gas as the inert carrier gas/diluent for the reactive plasma etching gas or gases is replaced with at least one inert carrier gas/diluent having an atomic weight less than that of Ar, such as helium (He) and neon (Ne); and (2) the electrical power supplied to the plasma etching chamber is substantially equal to that supplied to the plasma etching chamber when Ar is utilized, effectively addresses and solves the need for improved methodology for forming submicron-dimensioned recesses in, e.g., dielectric layers, by means of reactive plasma etching, particularly in the manufacture of multi-level metallization semiconductor integrated circuit (IC) devices. Further, the methodology provided by the present invention can be easily implemented in a cost-effective manner utilizing conventional reactive plasma etching apparatus. Finally, the methodology afforded by the instant invention enjoys diverse utility in the manufacture of numerous and various types of semiconductor devices and/or components.

DISCLOSURE OF THE INVENTION

An advantage of the present invention is an improved method for forming at least one recess in a surface of a workpiece by means of reactive plasma etching.

Another advantage of the present invention is an improved method for forming a plurality of submicron-dimensioned recesses in a dielectric layer by means of a reactive plasma etching process which eliminates, or at least substantially reduces, deleterious loss of a critical opening dimension (CD) of an ultra-thin patterned mask utilized for performing the reactive plasma etching process.

Still another advantage of the present invention is an improved method for performing recess pattern formation of a dielectric layer overlying a semiconductor substrate as part of a process for manufacturing a semiconductor integrated circuit (IC) device.

Additional advantages and other features of the present invention will be set forth in the description which follows and in part will become apparent to those having ordinary skill in the art upon examination of the following or may be learned from the practice of the invention. The advantages of the present invention may be realized as particularly pointed out in the appended claims.

According to an aspect of the present invention, the foregoing and other advantages are obtained in part by a method of forming at least one recess in a surface of a workpiece by reactive plasma etching, comprising the steps of:

(a) providing the interior space of a plasma etching chamber with a workpiece including a layer of a masking material on a surface thereof, the layer of masking material comprising at least one opening extending therethrough and having a critical opening dimension ("CD") for exposing a selected portion of the workpiece surface;

(b) supplying the interior space of the plasma etching chamber with a gas mixture comprised of at least one reactive plasma etching gas and a carrier gas/diluent for the at least one reactive plasma etching gas, the carrier gas/diluent comprising at least one inert gas having an atomic weight less than that of argon (Ar); and (c) forming at least one recess in the workpiece surface by reactive plasma etching utilizing the gas mixture and the layer of masking material for determining the position and dimensions of the at least one recess, the CD of the at least one opening in the layer of masking material remaining substantially constant during the reactive plasma etching, the reactive plasma etching comprising generating within the plasma etching chamber a plasma comprising the at least one reactive plasma etching gas and the carrier gas/diluent by supplying electrical power thereto at a level substantially equal to that supplied to the plasma etching chamber when utilizing Ar gas as a carrier gas/diluent for the at least one reactive plasma etching gas, thereby eliminating, or at least substantially reducing, deleterious sputter etching of the layer of masking material due to bombardment thereof by ions of the carrier gas/diluent during the plasma etching resulting in loss of the CD, relative to when Ar gas is utilized as the carrier gas/diluent.

According to an embodiment of the present invention, step (a) comprises providing a workpiece comprising a semiconductor substrate with a dielectric layer formed thereon, the dielectric layer comprising the workpiece surface, and the layer of masking material comprises a layer of a photoresist or hard mask material; and step (b) comprises supplying the interior space of the plasma etching chamber with a gas mixture comprised of at least one halogen-containing gas as the at least one reactive plasma etching gas and at least one of helium (He) and neon (Ne) gas as the carrier gas/diluent.

In accordance with embodiments of the present invention, step (b) further comprises including at least one of oxygen ($O_2$) gas, nitrogen ($N_2$) gas, and hydrogen ($H_2$) gas in the gas mixture; and step (b) comprises supplying said interior space of the plasma etching chamber with at least a chlorocarbon gas as the at least one reactive plasma etching gas, or step (b) comprises supplying the interior space of the plasma etching chamber with at least a fluorocarbon gas as the at least one reactive plasma etching gas, or step (b) comprises supplying the interior space of the plasma etching chamber with at least a chlorofluorocarbon gas as the at least one reactive plasma etching gas.

According to particular embodiments of the present invention, step (b) comprises providing a workpiece having a dielectric layer thereon formed of a dielectric material selected from oxides, nitrides, and oxynitrides of silicon, or from a low dielectric constant ("low k") material selected from hydrogen silsesquioxane ("HSQ")-based materials (e.g.,FOx™ and XLK™), tetraethyl orthosilicate ("TEOS")-based materials, benzocyclobutene ("BCB"), parylene, polyimide, aromatic hydrocarbon-based polymers (e.g., SiLK™), trimethyl silane based materials (e.g., Black Diamond™), carbon-doped silicon oxides (e.g. Coral™), etc.

In accordance with embodiments of the present invention, step (b) comprises providing a workpiece including an ultra-thin layer of masking material having a thickness of from about 300 to about 1,500 Å; and according to particular embodiments, step (b) comprises providing a workpiece wherein the ultra-thin layer of masking material includes a plurality of spaced-apart openings each extending through the layer of masking material to expose a plurality of selected portions of the workpiece surface, each of the openings having a position and CD corresponding to a submicron-dimensioned recess to be formed in the workpiece surface in step (c); and step (c) comprises forming a plurality of high aspect ratio, submicron-dimensioned recesses in the surface of the dielectric layer for use in subsequent formation of vias, interlevel metallization, and/or interconnection routing of at least one active device region or component formed on or within the semiconductor substrate.

According to embodiments of the present invention, step (c) comprises supplying the interior space of the plasma etching chamber with radio frequency ("RF") or microwave ("$\mu$wave") electrical power.

According to another aspect of the present invention, a method of manufacturing a semiconductor device comprises the sequential steps of:

(a) providing a workpiece comprising:
  (i) a semiconductor substrate including at least one active device region or component formed therein or thereon;
  (ii) a layer of a dielectric material overlying the substrate and having a surface; and
  (iii) a layer of a masking material overlying the surface of the layer of dielectric material, the layer of masking material comprising at least one opening extending therethrough and having a critical opening dimension ("CD") for exposing a selected portion of the surface of the layer of dielectric material; and (b) forming at least one recess in the surface of the dielectric layer by a reactive plasma etching process, comprising:
  (i) installing the workpiece within the interior space of a plasma etching chamber;
  (ii) supplying the interior space of the plasma etching chamber with a gas mixture comprised of at least one reactive plasma etching gas and a carrier gas/diluent for the reactive plasma etching gas, the carrier gas/diluent comprising at least one inert gas having an atomic weight less than that of argon (Ar); and
  (iii) reactive plasma etching at least the selected portion of the surface of the dielectric layer exposed through the at least one opening in the layer of masking material, the CD of the at least one opening in the layer of masking material remaining substantially constant during the reactive plasma etching, the reactive plasma etching comprising generating within the plasma etching chamber a plasma comprising the at least one reactive plasma etching gas and the carrier gas/diluent by supplying electrical power thereto at a level substantially equal to that supplied to the plasma etching chamber when utilizing Ar gas as a carrier gas/diluent for the at least one reactive plasma etching gas, thereby eliminating, or at least substantially reducing, deleterious sputter etching of the layer of masking material due to bombardment thereof by ions of the carrier gas/diluent during the plasma etching resulting in loss of the CD, relative to when Ar gas is utilized as the carrier gas/diluent.

According to embodiments of the present invention, step (a) comprises providing a workpiece wherein the semiconductor substrate is comprised of a wafer of monocrystalline silicon (Si) or gallium arsenide (GaAs); the layer of dielectric material is comprised of a dielectric material selected from oxides, nitrides, and oxynitrides of Si or from a low dielectric constant ("low k") material selected from hydrogen silsesquioxane ("HSQ")-based materials, tetraethyl orthosilicate ("TEOS")-based materials, benzocyclobutene ("BCB"), parylene, polyimide, aromatic hydrocarbon-based polymers, trimethyl silane-based materials, and carbon-doped silicon oxides; and the layer of masking material is comprised of an ultra-thin layer of a photoresist material or hard mask material having a thickness of from about 300 to about 1,500 Å.

In accordance with particular embodiments of the present invention, step (a) further comprises providing a workpiece wherein the ultra-thin layer of masking material includes a plurality of spaced-apart openings each extending through the layer of masking material to expose a plurality of selected portions of the surface of the layer of dielectric material, each of the openings having a position and CD corresponding to a submicron-dimensioned recess to be formed in the surface of the dielectric layer in step (b).

According to further embodiments of the present invention, step (b) comprises forming a plurality of high aspect ratio, submicron-dimensioned recesses in the surface of the dielectric layer for use in forming vias, interlevel metallization, and/or interconnection routing of the at least one active device region or component of the semiconductor substrate.

In accordance with embodiments of the present invention, step (b) comprises supplying the interior space of the plasma etching chamber with a gas mixture comprised of at least one halogen-containing gas as the at least one plasma etching gas and at least one of helium (He) and neon as the carrier gas/diluent; and step (b) further comprises including at least one of oxygen ($O_2$) gas, nitrogen ($N_2$) gas, and hydrogen ($H_2$) in the gas mixture.

Embodiments of the present invention include supplying the interior space of the plasma etching chamber with at least one reactive plasma etching gas selected from the group consisting of chlorocarbon, fluorocarbon, and chlorofluorocarbon gases and supplying the plasma etching chamber with radio frequency ("RF") or microwave ("μwave") electrical power.

Additional advantages and aspects of the present invention will become apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that deleterious physical sputtering of a patterned masking layer on a surface of a workpiece, such as a semiconductor substrate with an overlying layer of dielectric material, which frequently occurs during recess formation in the dielectric layer by reactive plasma etching utilizing at least one halogen-containing reactive plasma etching gas and Ar gas as an inert carrier gas/diluent for the at least one reactive plasma etching gas and leads to an undesirable loss of critical dimension (CD) of the mask opening, can be avoided, or at least substantially reduced, so as to facilitate formation of recesses with precisely controlled dimensions. A key feature, i.e., advantage, of the present invention when utilized as part of the "back-end" metallization processing of multi-level semiconductor IC devices, is the substantial elimination of undesired increase in the sizes or dimensions of the metallization features formed by subsequent filling of the recesses with metal. According to the invention, loss of the critical dimension (CD) of an opening formed in a patterned masking layer utilized in recess formation by reactive plasma etching is eliminated, or at least substantially reduced, by (1) replacing the Ar carrier/diluent gas with at least one inert gas of lower atomic weight, e.g., He and/or Ne; and (2) applying substantially the same level of electrical power to the plasma reactor as when Ar is utilized, whereby deleterious physical sputtering of the thin layer of patterned masking material overlying the layer subjected to reactive plasma etching for recess formation is effectively avoided. As a consequence of the inventive methodology, high-quality, multi-metallization level semiconductor IC devices can be readily and cost-effectively fabricated utilizing otherwise conventional methodologies and instrumentalities. Further, the inventive methodology is applicable to all manner of plasma etching processes for patterning of workpiece surfaces.

Figure 1A:
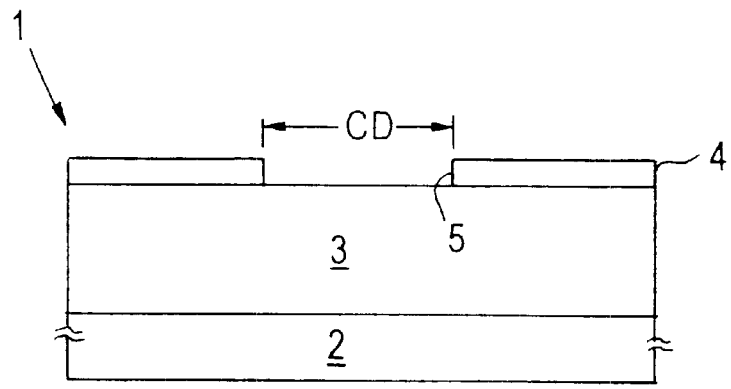
FIGS. 1(A)–1(C) illustrate, in simplified, cross-sectional schematic form, sequential initial, intermediate, and final phases of a conventional reactive plasma etching process for forming a submicron-dimensioned recess in a dielectric layer utilizing an ultra-thin masking layer.
Figure 1B:
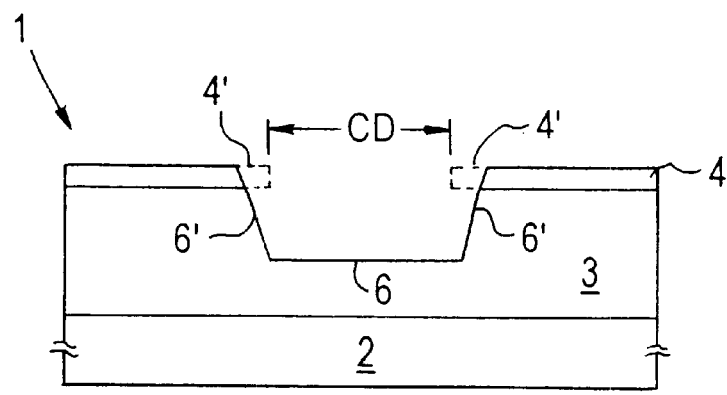
Figure 1C:
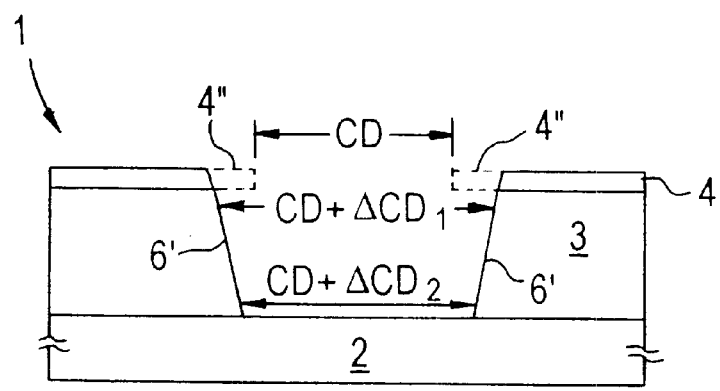
Figure 2A:
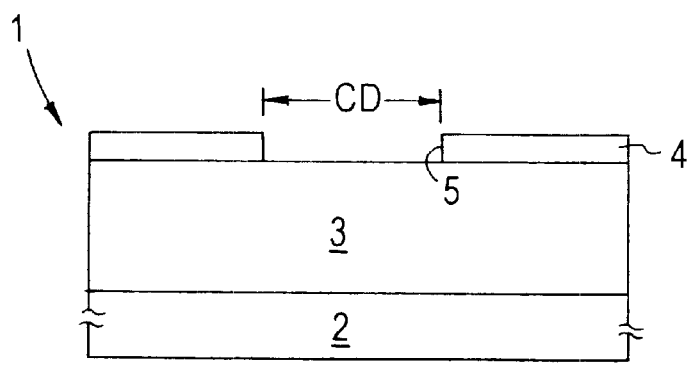
FIGS. 2(A)–2(C) illustrate, in simplified, cross-sectional schematic form, corresponding sequential initial, intermediate, and final phases of a reactive plasma etching process performed according to the inventive methodology.
Figure 2B:
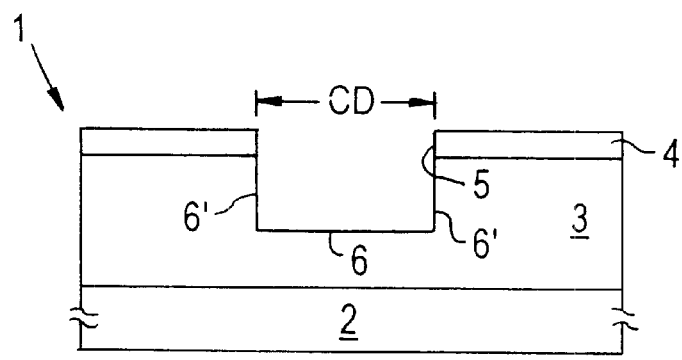

Referring now to FIGS. 2(A)–2(B), shown therein are simplified, cross-sectional views analogous to those of the above-described FIGS. 1(A)–1(C), respectively, illustrating etch profiles during the initial, intermediate, and final stages of formation of recess 6 in dielectric layer 3 of workpiece 1 by a reactive plasma etching process performed under similar conditions as in the situation illustrated in FIG. 1, e.g., substantially same level of RF or μw power applied to the plasma etching chamber, i.e., about 500 W; substantially similar chamber pressure, i.e., about 30–200 mTorr; and substantially similar flow rates of the reactive plasma etching gas and inert carrier gas/diluent, i.e., about 50–400 sccm of $C_4H_8$ or $C_4H_8$+ at least one of $O_2$, $N_2$, and $H_2$ and about 100–700 sccm inert gas, respectively, with the exception of replacement of the Ar utilized as the carrier gas/diluent in the FIG. 1 situation with He, Ne, or a mixture of He and Ne.

Figure 2C:
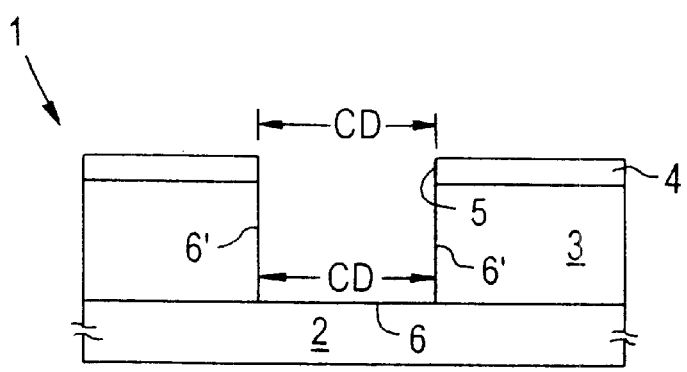

As is evident from a comparison of FIGS. 1 and 2, according to the inventive methodology, wherein the conventional Ar carrier gas/diluent for the reactive plasma etching gas(es) is replaced with at least one inert gas of lower atomic weight and substantially the same level of RF or μwave electrical power is supplied to the plasma etching chamber, the critical dimension CD of the opening 5 in the thin masking layer 4 is maintained substantially constant throughout the reactive plasma etching of dielectric layer 3 to form recess 6 therein. As a consequence of the maintenance of the CD of the mask opening 5, the recess sidewalls 6' are substantially vertical upon completion of recess formation, and thus perpendicular to the surface of workpiece 1, whereby critical submicron recess dimensions such as trench width or hole diameter are obtained as determined by the original mask opening dimension, with little or substantially no width variation with recess depth.

Advantageously, the inventive methodology is applicable for use in recess formation in a wide variety of dielectric materials, including, but not limited to, oxides, nitrides, and oxynitrides of silicon, as well as a wide variety of low dielectric constant ("low k") materials, including, but not limited to, hydrogen silsesquioxane ("HSQ")-based materials, tetraethyl orthosilicate ("TEOS")-based materials, benzocyclobutene ("BCB"), parylene, polyimide, aromatic hydrocarbon-based polymers, trimethyl silane-based materials, and carbon-doped silicon oxides. Further, the invention may be practiced with a number of different types of masking materials, including organic polymer-based photoresists, such as, for example, UV-activated acetal resins, and inorganic-based "hard mask" materials, such as silicon nitrides. Finally, the invention may be practiced with all manner of halogen-containing gases utilized in conventional reactive plasma etching processes, including, inter alia, chlorocarbons, fluorocarbons, and chlorofluorocarbon gases, each with or without oxygen gas in admixture therewith.

While the exact mechanism for the observed differences in behavior between reactive etching plasmas containing Ar as an inert carrier gas/diluent and similar reactive etching plasmas containing He or Ne is not known with certainty, and not desirous of being bound by any particular theory, it is nonetheless believed that the elimination or substantial reduction in undesired physical sputtering of the thin masking layer associated with the use of such lower atomic weight inert gases (e.g., He and Ne), which physical sputtering can result in disadvantageous loss of critical dimension of the mask opening, hence recess critical dimension, is largely attributable to the reduced amount of ionization obtained with the lower atomic weight gases He and Ne, for a given level of electrical power applied to the plasma etching chamber. Stated somewhat differently, for substantially the same level of plasma generation power applied to the chamber under the same or similar conditions, fewer atoms of the lower atomic weight inert gases (He or Ne) are ionized than is the case with the heavier Ar atoms. As a consequence of the decreased generation of inert gas ions in the plasma, a considerably lesser amount of ion bombardment of the patterned masking layer occurs, in turn leading to a significantly reduced amount of unwanted physical sputtering thereof when He or Ne is substituted for Ar and substantially the same plasma power level is supplied to the reactor as when Ar is utilized.

As a consequence of the above-described inventive methodology, precisely dimensioned recesses leading to formation of high quality, low resistance electrical contacts, interconnections, and metallization patterns for use in semiconductor IC devices may be advantageously formed in a rapid, cost-effective manner utilizing conventional manufacturing methodologies, apparatus and instrumentalities. For example, the inventive methodology enjoys utility in metallization processing utilizing dual-damascene techniques, wherein an opening is formed in an inter-layer dielectric ("ILD") comprising a lower, contact or via opening section communicating with an upper, trench opening section, followed by filling of both the lower and upper sections of the opening with an electrically conductive material, to simultaneously form a conductive (via) plug in electrical contact with a conductive line.

In addition, the inventive methodology enjoys utility in the manufacture of various other electrical and electronic devices and components wherein recesses must be formed in particular layers by reactive plasma etching without incurring loss of critical dimension (CD) of an overlying masking layer by physical sputtering thereof, e.g., as in circuit board manufacture. Finally, the invention can be practiced at rates consistent with the product throughput requirements of automated manufacturing processes and is filly compatible with conventional process flow for the manufacture of semiconductor IC devices and components.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes or modifications within the scope of the inventive concept as expressed herein.

What is claimed is:

1. A method of forming at least one recess in a surface of a workpiece by reactive plasma etching in a plasma etching chamber having an interior space, comprising the steps of:

(a) providing the interior space of a plasma etching chamber with a workpiece including a layer of a masking material on a surface thereof, said layer of masking material comprising at least one opening extending therethrough and having a critical opening dimension ("CD") for exposing a selected portion of said workpiece surface;

(b) supplying said interior space of said plasma etching chamber with a gas mixture comprised of at least one reactive plasma etching gas and a carrier gas/diluent for said at least one reactive plasma etching gas, said carrier gas/diluent consisting essentially of at least one inert gas having an atomic weight less than that of argon (Ar); and (c) forming at least one recess in said workpiece surface by reactive plasma etching utilizing said gas mixture and said layer of masking material for determining the position and dimensions of said at least one recess, said CD of said at least one opening in said layer of masking material remaining substantially constant during said reactive plasma etching, said reactive plasma etching comprising generating within said plasma etching chamber a plasma comprising said at least one reactive plasma etching gas and said carrier gas/diluent by supplying electrical power thereto at a level substantially equal to that supplied to the plasma etching chamber when utilizing Ar gas as a said carrier gas/diluent for said at least one reactive plasma etching gas, thereby eliminating, or at least substantially reducing, deleterious sputter etching of said layer of masking material due to bombardment thereof by ions of said carrier gas/diluent during said plasma etching resulting in loss of said CD, relative to when Ar gas is utilized as said carrier gas/diluent.

2. The method as in claim 1, wherein:

step (a) comprises providing a workpiece comprising a semiconductor substrate with a dielectric layer formed thereon, said dielectric layer comprising said workpiece surface, and said layer of masking material comprises a layer of a photoresist or hard mask material.

3. The method as in claim 2, wherein:
step (b) comprises supplying said interior space of said plasma etching chamber with a gas mixture comprised of at least one halogen-containing gas as said at least one reactive plasma etching gas and at least one of helium (He) and neon (Ne) gas as said carrier gas/diluent.

4. The method as in claim 3, wherein:
step (b) further comprises including at least one of oxygen ($O_2$) gas, nitrogen ($N_2$) gas, and hydrogen ($H_2$) gas in said gas mixture.

5. The method as in claim 3, wherein:
step (b) comprises supplying said interior space of said plasma etching chamber with at least a chlorocarbon gas as said at least one reactive plasma etching gas.

6. The method as in claim 3, wherein:
step (b) comprises supplying said interior space of said plasma etching chamber with at least a fluorocarbon gas as said at least one reactive plasma etching gas.

7. The method as in claim 3, wherein:
step (b) comprises supplying said interior space of said plasma etching chamber with at least a chlorofluorocarbon gas as said at least one reactive plasma etching gas.

8. The method as in claim 2, wherein:
step (b) comprises providing a workpiece having a dielectric layer thereon formed of a dielectric material selected from oxides, nitrides, and oxynitrides of silicon, or from a low dielectric constant ("low k") material selected from hydrogen silsesquioxane ("HSQ")-based materials, tetraethyl orthosilicate ("TEOS")-based materials, benzocyclobutene ("BCB"), parylene, polyimide, aromatic hydrocarbon-based polymers, trimethyl silane-based materials, and carbon-doped silicon oxides.

9. The method as in claim 2, wherein:
step (b) comprises providing a workpiece including an ultra-thin layer of masking material having a thickness of from about 300 to about 1500 Å.

10. The method as in claim 9, wherein:
step (b) comprises providing a workpiece wherein said ultra-thin layer of masking material includes a plurality of spaced-apart openings each extending through said layer of masking material to expose a plurality of selected portions of said workpiece surface, each of said openings having a position and CD corresponding to a submicron-dimensioned recess to be formed in said workpiece surface in step (c).

11. The method as in claim 10, wherein:
step (c) comprises forming a plurality of high aspect ratio, submicron-dimensioned recesses in the surface of said dielectric layer for use in subsequent formation of vias, interlevel metallization, and/or interconnection routing of at least one active device region or component formed on or within said semiconductor substrate.

12. The method as in claim 1, wherein:
step (c) comprises supplying said interior space of said plasma etching chamber with radio frequency ("RF") or microwave ("µwave") electrical power.

13. A method of manufacturing a semiconductor device, comprising the sequential steps of:
(a) providing a workpiece comprising:
  (i) a semiconductor substrate including at least one active device region or component formed therein or thereon;
  (ii) a layer of a dielectric material overlying said substrate and having a surface; and
  (iii) a layer of a masking material overlying said surface of said layer of dielectric material, said layer of masking material comprising at least one opening extending therethrough and having a critical opening dimension ("CD") for exposing a selected portion of said surface of said layer of dielectric material; and
(b) forming at least one recess in said surface of said dielectric layer by a reactive plasma etching process, comprising:
  (i) installing said workpiece within an interior space of a plasma etching chamber;
  (ii) supplying said interior space of said plasma etching chamber with a gas mixture comprised of at least one reactive plasma etching gas and a carrier gas/diluent for said reactive plasma etching gas, said carrier gas/diluent consisting essentially of at least one inert gas having an atomic weight less than that of argon (Ar); and
  (iii) reactive plasma etching at least said selected portion of said surface of said dielectric layer exposed through said at least one opening in said layer of masking material, said CD of said at least one opening in said layer of masking material remaining substantially constant during said reactive plasma etching, said reactive plasma etching comprising generating within said plasma etching chamber a plasma comprising said at least one reactive plasma etching gas and said carrier gas/diluent by supplying electrical power thereto at a level substantially equal to that supplied to the plasma etching chamber when utilizing Ar gas as a carrier gas/diluent for said reactive plasma etching gas, thereby eliminating, or at least substantially reducing, deleterious sputter etching of said layer of masking material due to bombardment thereof by ions of said carrier gas/diluent during said plasma etching resulting in loss of said CD, relative to when Ar gas is utilized as said carrier gas/diluent.

14. The method as in claim 13, wherein:
step (a) comprises providing a workpiece wherein said semiconductor substrate is comprised of a wafer of monocrystalline silicon (Si) or gallium arsenide (GaAs); said layer of dielectric material is comprised of a dielectric material selected from oxides, nitrides, and oxynitrides of Si or from a low dielectric constant ("low k") material selected from hydrogen silsesquioxane ("HSQ")-based materials, tetraethyl orthosilicate ("TEOS")-based materials, benzocyclobutene ("BCB"), parylene, polyimide, aromatic hydrocarbon-based polymers, trimethyl silane-based materials, and carbon-doped silicon oxides; and said layer of masking material is comprised of an ultra-thin layer of a photoresist material or hard mask material having a thickness of from about 300 to about 1500 Å.

15. The method as in claim 14, wherein:
step (a) further comprises providing a workpiece wherein said ultra-thin layer of masking material includes a plurality of spaced-apart openings each extending through said layer of masking material to expose a plurality of selected portions of said surface of said layer of dielectric material, each of said openings having a position and CD corresponding to a submicron-dimensioned recess to be formed in said surface of said dielectric layer in step (b).

16. The method as in claim 15, wherein:
step (b) comprises forming a plurality of high aspect ratio, submicron-dimensioned recesses in said surface of said dielectric layer for use in forming vias, interlevel metallization, and/or interconnection routing of said at least one active device region or component of said semiconductor substrate.

17. The method as in claim 13, wherein:

step (b) comprises supplying said interior space of said plasma etching chamber with a gas mixture comprised of at least one halogen-containing gas as said at least one plasma etching gas and at least one of helium (He) and neon (Ne) as said carrier gas/diluent.

18. The method as in claim 17, wherein:

step (b) further comprises including at least one of oxygen ($O_2$) gas, nitrogen ($N_2$) gas, and hydrogen ($H_2$) gas in said gas mixture.

19. The method as in claim 17, wherein:

step (b) comprises supplying said interior space of said plasma etching chamber with at least one reactive plasma etching gas selected from the group consisting of chlorocarbon, fluorocarbon, and chlorofluorocarbon gases.

20. The method as in claim 13, wherein:

step (b) comprises supplying said plasma etching chamber with radio frequency ("RF") or microwave ("$\mu$wave") electrical power.

* * * * *